US006933759B1

(12) United States Patent
Wu et al.

(10) Patent No.: US 6,933,759 B1
(45) Date of Patent: Aug. 23, 2005

(54) SYSTEMS AND METHODS OF PERFORMING DUTY CYCLE CONTROL

(75) Inventors: Lin Wu, Richardson, TX (US); Robert Floyd Payne, Allen, TX (US); Paul Eric Landman, Allen, TX (US); Woo Jin Kim, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 10/773,554

(22) Filed: Feb. 5, 2004

(51) Int. Cl.[7] .............................................. H03K 3/017
(52) U.S. Cl. ...................... 327/172; 327/175; 327/100
(58) Field of Search ............................... 327/172–176, 327/97, 180, 50–52, 63–65, 100, 104

(56) References Cited

U.S. PATENT DOCUMENTS

| | | | | |
|---|---|---|---|---|
| 4,527,075 A | * | 7/1985 | Zbinden | 327/175 |
| 5,157,277 A | * | 10/1992 | Tran et al. | 327/156 |
| 5,455,530 A | * | 10/1995 | Huppenthal et al. | 327/175 |
| 5,572,158 A | * | 11/1996 | Lee et al. | 327/175 |
| 6,066,972 A | * | 5/2000 | Strom | 327/175 |
| 6,072,840 A | * | 6/2000 | Dreps | 375/316 |
| 6,169,434 B1 | * | 1/2001 | Portmann | 327/175 |
| 6,472,918 B1 | * | 10/2002 | Mosinskis et al. | 327/175 |
| 6,525,581 B1 | * | 2/2003 | Choi | 327/175 |
| 6,542,015 B2 | | 4/2003 | Zhou et al. | |
| 6,690,202 B1 | * | 2/2004 | Groen et al. | 326/93 |
| 2003/0204767 A1 | | 10/2003 | Ishida et al. | |

* cited by examiner

Primary Examiner—Kenneth B. Wells
Assistant Examiner—Hai L. Nguyen
(74) Attorney, Agent, or Firm—Alan K. Stewart; W. James Brady, III; Frederick J. Telecky, Jr.

(57) ABSTRACT

The present invention facilitates serial communication by performing duty cycle correction. A duty cycle correction component 302 performs duty cycle corrections on a pair of differential sinusoidal signals according to a pair of adjustment signals and, as a result, generates a differential pair of square wave signals. A cross coupled buffer 306 buffers the differential pair of square wave signals and provides the buffered signals to a feedback circuit 304 that measures duty cycles of the signals and generates the pair of adjustment signals accordingly. The buffer 306 can also remove skew from the signals. In a transmitter 102, the buffered signals are also generally provided to a multiplexer 112 or encoder and in a receiver 106, the buffered signals are also generally provided to a sampling component 122.

21 Claims, 12 Drawing Sheets

US 6,933,759 B1

SYSTEMS AND METHODS OF PERFORMING DUTY CYCLE CONTROL

FIELD OF THE INVENTION

The present invention relates generally to high speed serial data communication, and more particularly, to systems and methods that perform duty cycle control of the clock.

BACKGROUND OF THE INVENTION

Generally, serial data communication includes a transmitter and a receiver. The transmitter employs one or more internally generated high speed clocks to multiplex the data into a serial data stream that is then placed on a communication media. The serial data stream travels on the communication media and is then obtained from the media by the receiver. The serial data stream is then processed by the receiver in order to recover the original data. The receiver employs one or more internal generated high speed clocks in order to sample and recover the original data.

The duty cycle of these clocks is an important component in reducing timing error induced and maintaining a suitable level of bit error rate (BER) required by some communication standards especially when Half-Baud-Rate (HBR) clocks are used. Even though HBR clocks provide power advantage over their Full-Baud-Rate (FBR) counterpart, deviation from a desired duty cycle (e.g., fifty percent) increases ambiguity in data boundaries during transmission and re-sampling, and thus increases the probability of error. Furthermore, as serial communication speeds continue to increase to well over a Gigabit per second, duty cycle errors/distortions can become even more problematic.

What is needed are systems and methods that facilitate serial communication by detecting and correcting duty cycle errors/distortions in a relatively efficient manner.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates serial communications by providing systems and methods that perform duty cycle correction in a relatively efficient manner. The duty cycle correction performed can reduce data ambiguity within data boundaries during transmission and reduces a probability of error. The relatively efficient manner employed in the present invention facilitates high speed operation.

A duty cycle correction component of the present invention receives a pair of duty cycle uncorrected differential sinusoid signals. The component performs duty cycle corrections on the signals according to a pair of adjustment signals and, as a result, generates a complementary pair of square wave signals. A cross coupled buffer buffers the complementary pair of square wave signals and provides the buffered signals to a feedback circuit that measures duty cycles of the signals and generates the pair of adjustment signals accordingly. The buffer can also remove skew from the signals. In a transmitter, the buffered signals are also generally provided to a multiplexer and in a receiver, the buffered signals are also generally provided to a sampling component.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention facilitates serial communication by providing systems and methods that perform duty cycle corrections during sending/transmitting and receiving. The invention includes a differential to single end converter/amplifier that employs a current starving inverter to appropriately bias and generate clocks signals having a selected/desired duty cycle.

Figure 1A:
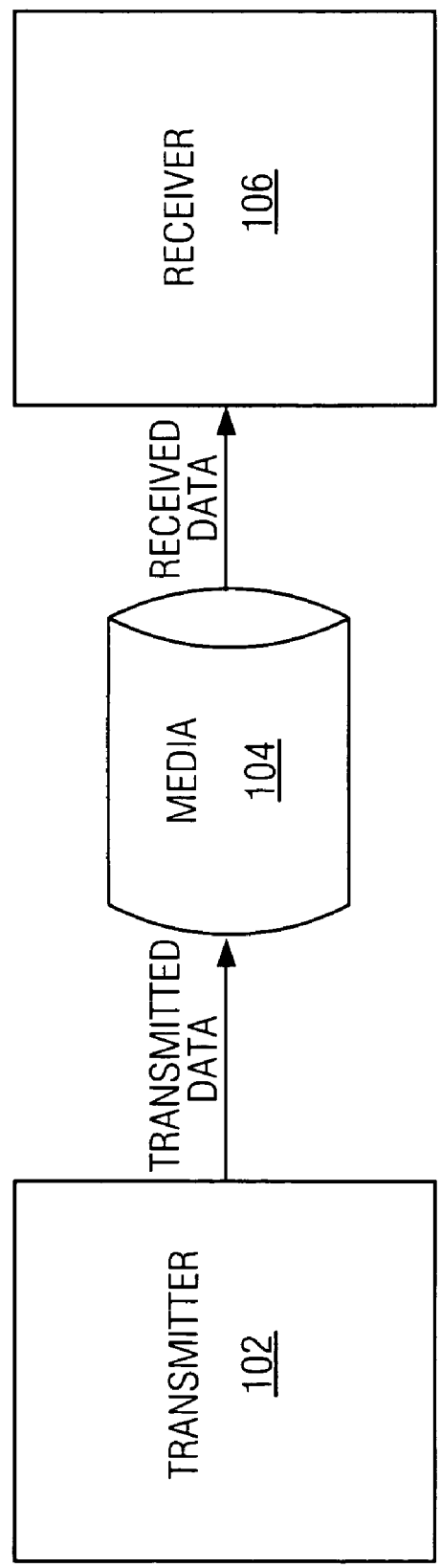
FIG. 1A is a diagram illustrating a serial communication system in accordance with an aspect of the present invention.

FIG. 1A is a diagram illustrating a serial communication system in accordance with an aspect of the present invention. The system includes a transmitter 102, a communication media 104, and a receiver 106. The transmitter 102 communicates with the receiver 106 over the communication media 104. The transmitter 102 and the receiver 106 can be implemented in discrete components or the circuit can be implemented in a single component and/or circuit. The communication media can be, for example any suitable media such as a bus, an IEEE 1394 bus (Firewire), a USB 1.1 bus, a USB 2.0 bus, copper wire, fiber optic cable, and the like. The communication system is a half baud rate system, however the present invention also includes full baud rate clocks/systems.

The transmitter 102 receives or has data that is to be transmitted. The data can be generated by another component (not shown), such as a computer system or other electronic component/device. An internal clock is employed by the transmitter 102 to represent the data as a transmitted serial data stream. The transmitted data is communicated or transmitted by the communication media 104 and is then received by the receiver 106 as a received serial data stream. The receiver 106 also has a clock that generally operates at a frequency substantially similar to that of the clock of the transmitter 102. However, it is appreciated that the clock employed by the receiver 106 is distinct from the clock employed by the transmitter 102. The receiver 106 employs its clock to substantially recover the original data from the received data stream. The recovered data can then be provided to other computer and/or electronic components and devices.

Ideally, for half baud rate systems the clocks of the transmitter 102 and the receiver 106 operate with a duty cycle of fifty percent. As a result, both edges of the clocks can be employed to synchronize data being transmitted and sample data received. Generally, two bits of data are transmitted per clock cycle. For example, in a single clock cycle a first bit can be transmitted when a clock is high and a second bit can be transmitted when the clock is low. Modulation techniques can be employed, such as quadrature amplitude modulation, such that a symbol instead of a bit is transmitted. For such modulation, two symbols can be transmitted in a clock cycle. Each of the symbols can represent multiple bits of information so that more than two bits of information can be transmitted in a single clock cycle.

As an example of half baud rate system, at a clock frequency of 500 MHz under ideal conditions, each data bit is transmitted for a period of 1 nano-second. However, in a non-ideal condition wherein the transmitter clock has a duty cycle of sixty percent, a first data bit is transmitted for 1.2 nano-seconds and a second bit is only transmitted for 0.8 nano-seconds. The data boundary ambiguity is 0.2 nano-second. As a result of such a duty cycle error (sixty percent duty cycle instead of fifty), jitter tolerance is decreased, there is an increased chance of data errors, and high speed operation of the system can be degraded or diminished.

The transmitter 102 and the receiver 106 are operable to correct duty cycle errors and mitigate jitter tolerance and permit high-speed operation. Both components can detect slight variations from the desired fifty percent duty cycle and make corrections accordingly. Further details of this operation are provided infra.

Figure 1B:
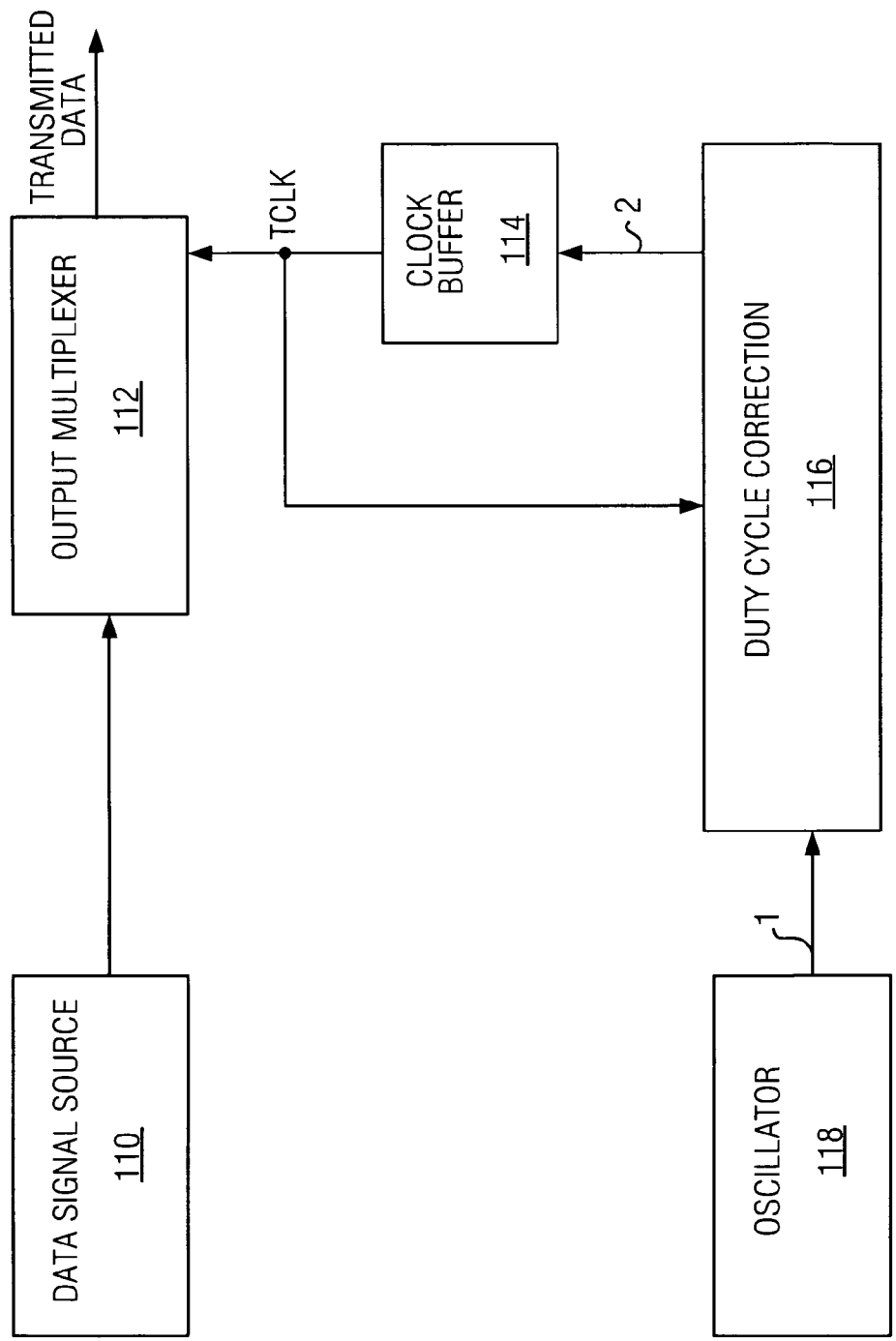
FIG. 1B is a block diagram of the transmitter of FIG. 1A in accordance with an aspect of the present invention.

FIG. 1B is a block diagram of the transmitter 102 of FIG. 1A in accordance with an aspect of the present invention. The transmitter 102 includes a data signal source 110, an output multiplexer 112, a clock buffer 114, a duty cycle correction component 116, and an oscillator 118.

The data signal source 110 operates as a source of data to be transmitted. The data signal source 110 can obtain data from a computer system or other computer/electronic device and can include buffers and/or other storage to hold the data until transmitted. The oscillator 118 in this example is a monolithic ring oscillator or inductor-capacitor (LC) oscillator and generates a sinusoidal clock signal 1 with a specific frequency and duty cycle. Generally, the duty cycle is selected to be at or about fifty percent. The oscillator 118 can include a clock generation component such as a phase locked loop (PLL) circuit or a frequency synthesizer. Although the oscillator 118 is a monolithic ring oscillator or LC oscillator, alternate aspects of the invention can include other suitable types of clock sources.

As stated above, the selected duty cycle for the oscillator 118 is typically at about fifty percent. However, duty cycle distortion can be introduced into the clock signal 1 by the oscillator and/its internal components. As a result, the clock signal 1 can include an amount of duty cycle distortion such that its duty cycle varies from the selected duty cycle.

The duty cycle correction component 116 receives the clock signal 1 from the oscillator 118 and performs duty cycle correction upon the clock signal 1 and generates a corrected clock signal 2. The clock buffer 114 buffers the corrected clock signal 2 and makes the buffered clock signal (TCLK) available as feedback to the duty cycle correction component 116 and the output multiplexer 112. The duty cycle correction component 116 employs the feedback (TCLK) in order to monitor the duty cycle and perform necessary corrections so that the corrected clock signal yields TCLK with a duty cycle within an acceptable range from the selected duty cycle after propagating through the clock buffer 114. The output multiplexer 112 receives the buffered clock (TCLK) from the clock buffer 114 and data from the data signal source 110 and combines the clock and data into the transmitted serial data stream. The transmitted data stream is provided to the communication media 104.

Figure 1C:
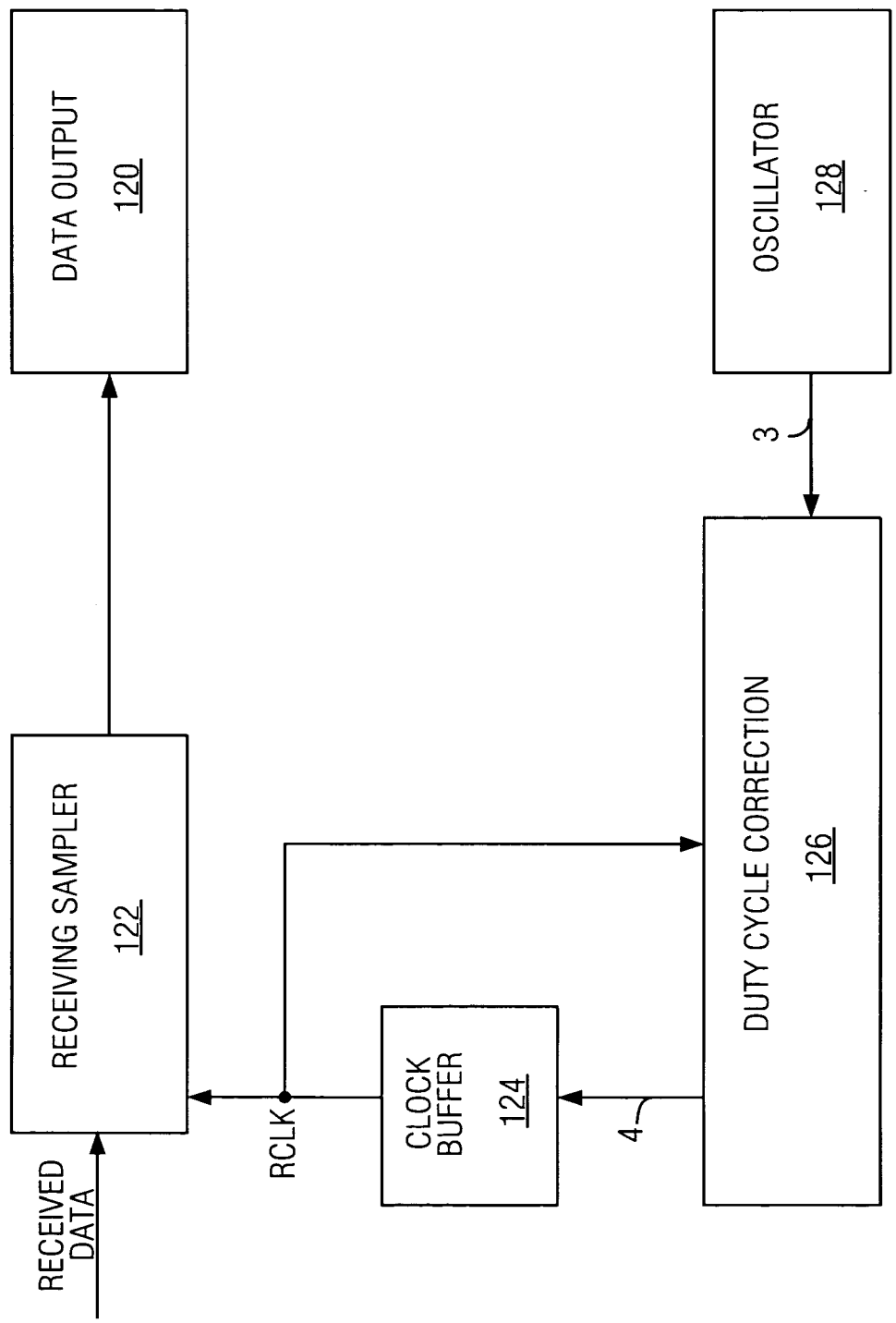
FIG. 1C is a block diagram of the receiver of FIG. 1A in accordance with an aspect of the present invention.

FIG. 1C is a block diagram of the receiver 106 of FIG. 1A in accordance with an aspect of the present invention. The receiver 106 includes a receiving sampler 122, a data output 120, a clock buffer 124, a duty cycle correction component 126, and an oscillator 128. The receiver obtains a received serial data stream from the communications media 104 and recovers original data therefrom.

The receiving sampler 122 is connected to the communications media 104 and obtains the received data stream therefrom. The receiving sampler 122 employs a buffered clock (RCLK) to sample the received data stream at selected times to recover the original data. The buffered clock has a frequency that matches a frequency employed by the transmitter 102 in generating the data stream. The receiving sampler 122 identifies appropriate data sampling times and can adjust sampling by steps or phases so as to obtain data from the received data stream. The recovered data is then provided to a data output component 120. The data output component can include buffers and/or other data storage and can provide the recovered data to other components and/or devices.

The oscillator 128 includes an oscillator and a clock generation circuit and generates a clock signal 3 with a selected frequency and duty cycle. Generally, the duty cycle is selected to be at or about fifty percent. The clock generation component can be a component such as a phase locked loop (PLL) circuit or a frequency synthesizer. Although the oscillator 128 is a monolithic ring oscillator or LC oscillator, alternate aspects of the invention can include other suitable types of clock sources.

As stated above, the selected duty cycle for the oscillator 128 is typically at about fifty percent. However, duty cycle distortion can be introduced into the clock signal 3 by the oscillator and its internal components. As a result, the clock signal 3 can include an amount of duty cycle distortion such that its duty cycle varies from the selected duty cycle.

The duty cycle correction component 126 receives the clock signal 3 from the oscillator 128 and performs duty cycle correction upon the clock signal 3 and generates a corrected clock signal 4. The clock buffer 124 buffers the corrected clock signal 4 and makes the buffered clock signal (RCLK) available as feedback to the duty cycle correction component 126 and the receiving sampler 122. The duty cycle correction component 126 employs the feedback (RCLK) in order to monitor the duty cycle and perform necessary corrections so that the corrected clock signal yields RCLK with a duty cycle within an acceptable range from the selected duty cycle after propagating through the clock buffer 124. The receiving sampler 122 receives the buffered clock from the clock buffer 124 and operates as described above to recover the original data from the received data stream.

Buffered clocks (RCLK and TCLK) are generally designed to provide a selected duty cycle of fifty percent, as described above. However, due to mismatch and process variations, circuit paths and other components can introduce a level of error or distortion that causes the buffered clocks to deviate from the desired fifty percent duty cycle square waves. FIGS. 2A, 2B, 2C, and 2D are described below in order to illustrate some of these duty cycle errors or distortions that can occur in and be corrected in communication systems in accordance with the present invention. For these figures, a solid line represents RCLK or TCLK and a dashed line represents its complement.

Figure 2A:
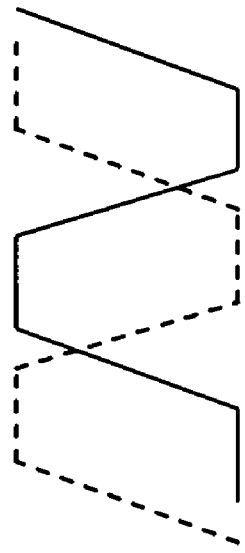
FIG. 2A is a timing diagram illustrating clock signals having wide/narrow pulses.

FIG. 2A is a timing diagram illustrating clock signals having wide/narrow pulses. In this scenario, one clock has more than a fifty percent duty cycle, referred to as a wide clock, and another has less than a fifty percent duty cycle, referred to as a narrow clock. The crossing points of the clocks are still near the middle point of a full swing.

Figure 2B:
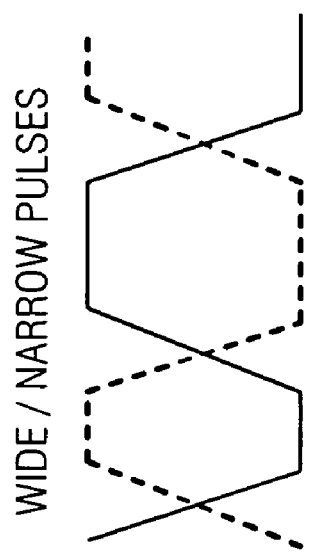
FIG. 2B is a timing diagram illustrating skewed pulses for clock signals.

FIG. 2B is a timing diagram illustrating clock signals having skewed pulses. In this scenario, one clock is early or late compared to its complementary clock even though both clocks have about a fifty percent duty cycle.

Figure 2C:
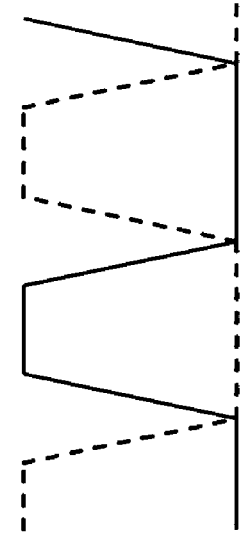
FIG. 2C is another timing diagram illustrating clock signals having high-crossed pulses or overlapping pulses.

FIG. 2C is another timing diagram illustrating clock signals having high-crossed pulses or overlapping pulses. In this scenario, both clocks have wide pulses with crossing points substantially higher than a middle point of a full swing. The crossing point reaches above full level so that the clocks overlap.

Figure 2D:
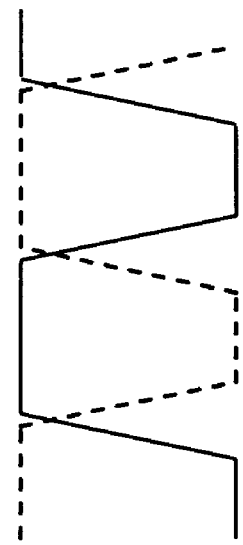
FIG. 2D is yet another timing diagram illustrating clock signals having low-crossed pulses or non-overlapping pulses.

FIG. 2D is yet another timing diagram illustrating clock signals having low-crossed pulses or non-overlapping pulses. In this scenario, both clocks have narrow pulses (less than fifty percent) and the crossing points are so low that the clocks fail to cross. As a result, the clocks are non-overlapping.

In general, duty cycle distortion or error is the result of mismatch in signal pull up and pull down. There are various mismatches that can cause different charging and discharging behavior. For example, DC offset of differential circuitry can produce the scenario of wide/narrow pulses described in FIG. 2A. The skewed pulses of FIG. 2B are often caused by unbalanced loading of the clock paths for the buffered clocks. A mismatch in strength of PFET and NFET components in the clock generators shifts the inverter threshold and can produce the high/low crossed pulses shown in FIGS. 2C and 2D. It is appreciated that more than one of the above mentioned duty cycle errors can co-exist and, therefore, overall duty cycle error can be a combination of the errors described in FIGS. 2A, 2B and 2C or 2D.

The duty cycle correction components 116 and 126 of FIGS. 1B and 1C are operable to detect and correct duty cycle errors/distortions as described with respect to FIGS. 2A, 2B, 2C, and 2D, described above. The duty cycle correction components 116 and 126 correct accumulated error of differential sinusoidal signals at their input and also correct duty cycle error caused during differential to single end conversion and successive clock buffering. Typically, duty cycle error is static error and can be corrected by adjusting threshold values or where the slew rate is relatively slow to change the timing where the two complementary clocks cross. The amount of adjustment is determined by the feedback (buffered clock). The present invention is operable to correct these types of distortions/errors.

Figure 3:
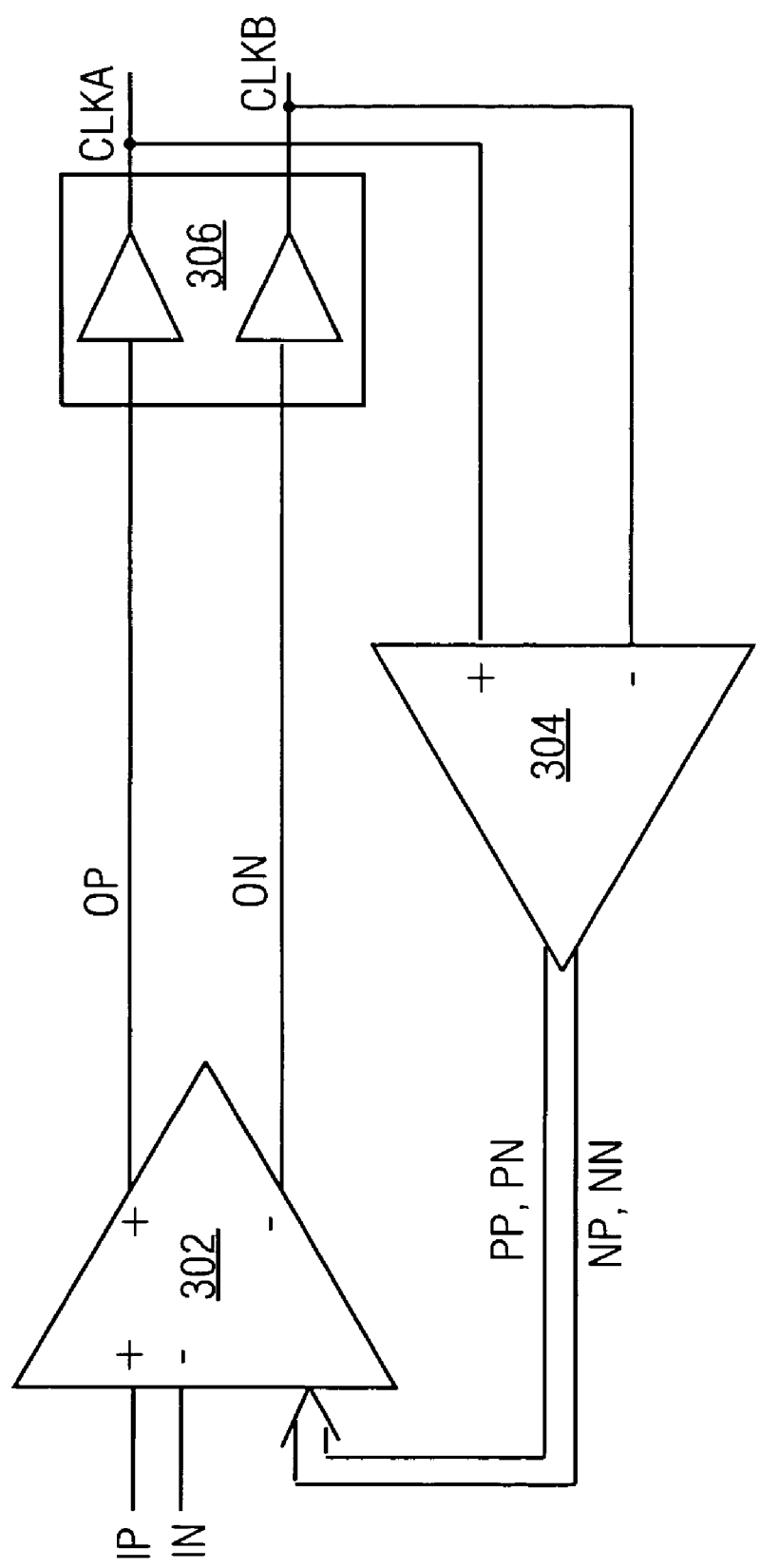
FIG. 3 is a schematic diagram illustrating a duty cycle correction component in accordance with an aspect of the present invention.

FIG. 3 is a schematic diagram illustrating a duty cycle correction component in accordance with an aspect of the present invention. The duty cycle correction component generates a buffered corrected clock (CLKA and CLKB) from a distorted clock (IP and IN). The components 302 and 304, described below, can be employed as duty cycle correction components 116 or 126 in FIGS. 1B and 1C. A clock buffer 306, described below, can be employed at the buffer 114 in FIG. 1B or 124 in FIG. 1C.

The duty cycle correction component includes a differential to single-ended amplifier (D2SE) or comparator, referred to as an amplifier circuit 302, and a duty cycle correction feedback circuit, referred to as a feedback circuit 304. The amplifier circuit 302 receives the distorted clock, IP and IN, on positive and negative inputs, respectively and also receives a first adjustment signal PP/PN and a second adjustment signal NP/NN from the feedback circuit 304. The amplifier circuit 302 generates a corrected clock signal as a complementary square wave signal OP and ON. A clock buffer 306 receives OP and ON and provides the buffered corrected clock (CLKA and CLKB). The clock buffer 306 includes a separate buffer for each line of the signal and typically has an even number of buffer stages for CLKA and CLKB. The buffered corrected clock (CLKA and CLKB) is provided to the feedback circuit 304, which measures the duty cycle of the buffered corrected clock (CLKA and CLKB). The feedback circuit 304 then generates the first and second pairs of adjustment signals (PP/PN and NP/NN) according to the measured duty cycle of the buffered corrected clock.

Figure 4:
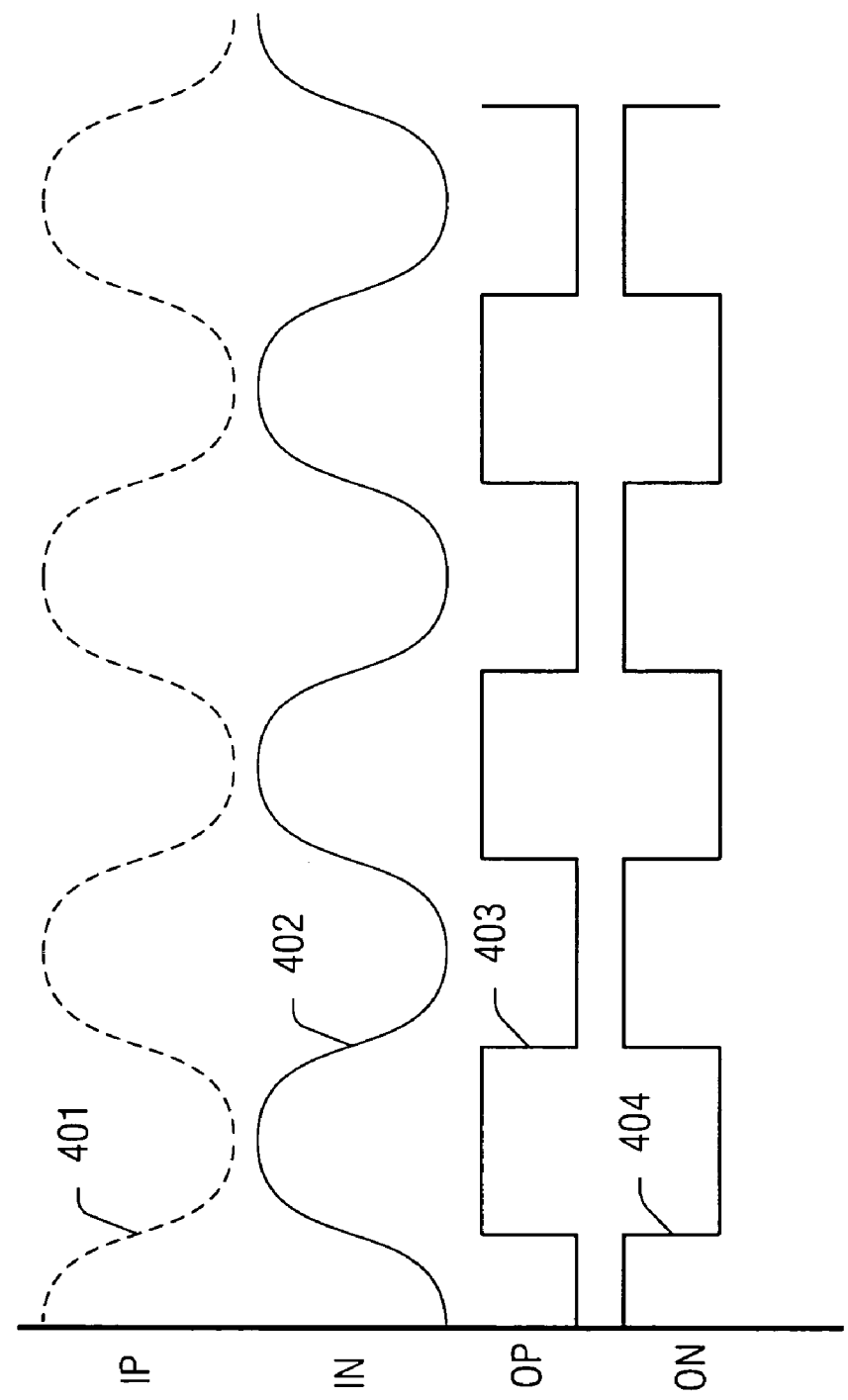
FIG. 4 is a timing diagram illustrating one example for a duty cycle correction component that receives a differential input signal and generates a complimentary output signal there from in accordance with an aspect of the present invention.

FIG. 4 is a timing diagram illustrating one example for a duty cycle correction component that receives differential input signals 401 and 402 and generates complimentary output signals 403 and 404 therefrom in accordance with an aspect of the present invention. The timing diagram illustrates exemplary signals of the amplifier 302 of FIG. 3. The input signals 401 and 402 comprise two sine waves that have 180 degrees phase shift. The amplifier 302 generates the output signal as two square waves that have 180 degrees relative phase shift. The output signals 403 and 404 have a duty cycle of about fifty percent in this example. The input signals 401 and 402 can have a relatively wide variation in duty cycle and yet, the component still produces the output signals 403 and 404 with a corrected duty cycle of about fifty percent, in this example.

Figure 5A:
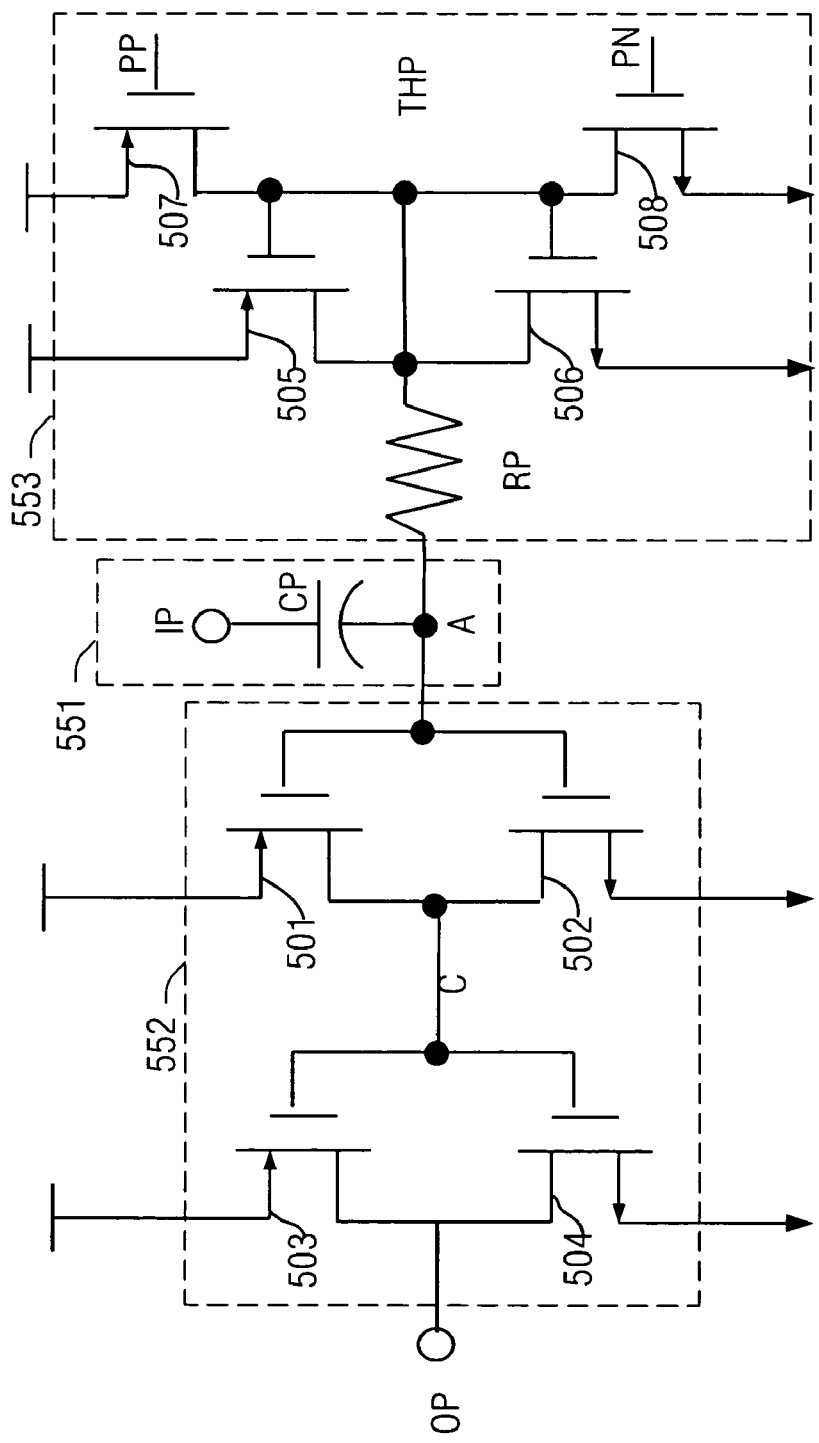
FIG. 5A is a schematic diagram illustrating a left half circuit of a differential to single end converter/amplifier in accordance with an aspect of the present invention.

FIG. 5A is a schematic diagram illustrating a left half circuit of a differential to single end converter/amplifier in accordance with an aspect of the present invention. The circuit can be employed in the amplifier 302 of FIG. 3. This portion of the amplifier is a positive signal path that obtains an input signal IP and generates an output signal OP. The input signal IP is a positive signal of a pair of incoming, uncorrected sinusoidal signals as shown at 1 in FIG. 1B or 3 in FIG. 1C. The output signal OP is a corrected full level CMOS un-buffered, positive clock signal of a pair of corrected clock signals as shown in FIG. 3 and FIG. 4.

The left half circuit comprises a coupling capacitor portion 551, an inverter based differential to single end converter portion 552, and a replica bias with DCC control portion 553. The coupling capacitor portion 551 serves to remove DC bias or components from the input signal. The inverter portion 552 serves to generate the output signal OP. The replica bias portion 553 serves to automatically track a threshold of an inverter formed by 501 and 502 over process, power supply, and temperature variations and set a correct DC bias level for the output signal.

The input signal is received at a first terminal of a capacitor CP. A second terminal of the capacitor CP is connected to node A. A gate of a first transistor 501 and a gate of a second transistor 502 are connected to the node A. A source of the first transistor 501 is connected to VDD and a drain of the first transistor 501 is connected to a node C. A drain of the second transistor 502 is connected to the node C and a source of the second transistor 502 is connected to ground. The first transistor 501 and the second transistor 502 operate as a first or first stage inverter to invert the signal at the node A to the node C. A gate of a third transistor 503 and a gate of a fourth transistor 504 are connected to the node C. A source of the third transistor 503 is connected to VDD and a drain of the third transistor 503 is connected to an output node for the signal OP. A drain of the fourth transistor 504 is also connected to the output node OP and a source of the fourth transistor 504 is connected to ground. The third transistor 503 and the fourth transistor 504 operate as a second inverter or second stage inverter and generate the corrected full-level CMOS positive clock signal OP.

For the replica bias portion 553, a first terminal of a resistor RP is connected to the node A and a second terminal is connected to a node THP. The value of the resistor RP is chosen such that it is low enough to couple the DC level of THP to node A while it is high enough to provide AC isolation between node THP and node A. A source of a fifth transistor 505 is connected to VDD and a drain and gate of the fifth transistor are connected to the node THP. A sixth transistor 506 has a drain and gate connected to the node THP and a source connected to ground. A source of a seventh transistor 507 is connected to VDD and a drain of the seventh transistor is connected to the node THP. A gate of the seventh transistor 507 is operable to receive a positive adjustment signal PP. An eighth transistor 508 has a drain also connected to the node THP and a source connected to ground. A gate of the eighth transistor 508 is operable to receive a negative adjustment signal PN.

The non-corrected sinusoidal signal IP is AC coupled to the inverter portion 552 through the capacitor CP. AC coupling removes the DC component of signal IP thus removes any duty cycle error introduced by the previous stages that generate IP. Due to the high speed operation and application of this circuit, the capacitance value of the capacitor CP can be relatively small so that is suitable for integration. The DC bias for the signal at the node A is provided by the replica bias portion 553, which is a diode connected inverter. The transistors 505 and 506 comprise a scaled inverter wherein the sizes of the transistors 505 and 506 are a scaled version of the first inverter comprised of the transistors 501 and 502. Employing replica bias after AC coupling automatically tracks a threshold of the first inverter comprised of the transistors 501 and 502 over process, power supply, and temperature variations and adjusts the DC bias level at the node A to a proper value. As a result, any substantial DC offset should be removed from the converter portion 552. The threshold value of the replica bias portion 553 can be further adjusted by selecting values of the seventh and eighth transistors 507 and 508. The gate of the seventh transistor 507 is controlled by the positive adjustment signal PP and the gate of the eighth transistor 508 is controlled by the negative adjustment signal PN, which operate together in a push-pull mode for the threshold value adjustment.

Figure 5B:
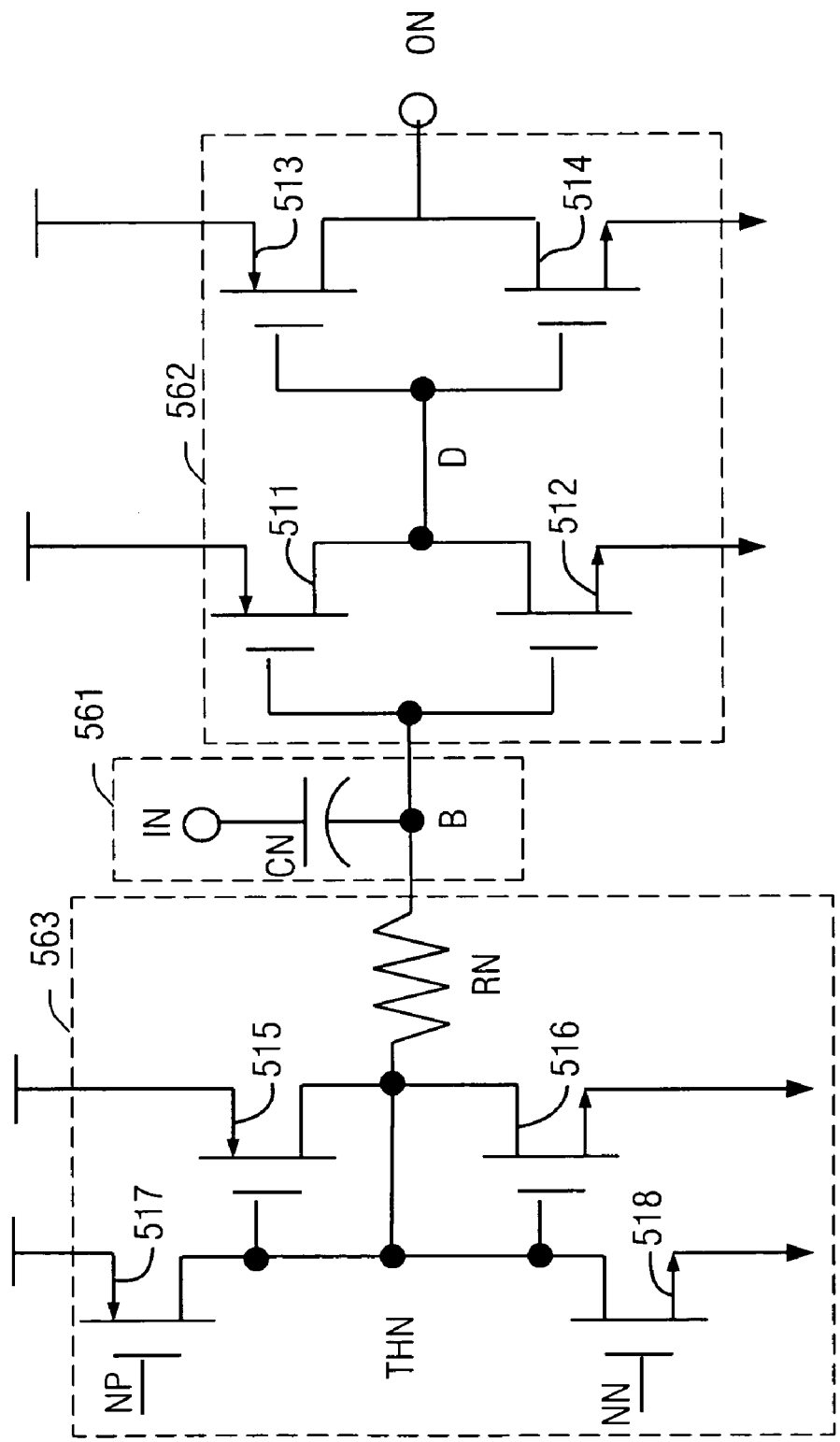
FIG. 5B is another schematic diagram illustrating a right half circuit of a differential to single end converter/amplifier in accordance with an aspect of the present invention.

FIG. 5B is another schematic diagram illustrating a right half circuit of a differential to single end converter/amplifier in accordance with an aspect of the present invention. The circuit can be employed in the amplifier 302 of FIG. 3. This portion of the amplifier is a negative signal path that obtains an input signal IN and generates an output signal ON. The input signal IN is a negative signal of a pair of incoming, uncorrected sinusoidal signals as shown at 1 in FIGS. 1B and 3 in FIG. 1C. The output signal ON is a corrected full level CMOS un-buffered, negative clock signal of a pair of corrected clock signals as shown in FIG. 3 and FIG. 4.

The right half circuit, similar to the left hand circuit of FIG. 5A, comprises a coupling capacitor portion 561, an inverter based differential to single end converter portion 562, and a replica bias with DCC control portion 563. The coupling capacitor portion 551 serves to remove DC bias or components from the input signal. The inverter portion 562 serves to generate the output signal ON. The replica bias portion 563 serves to automatically track a threshold value of an inverter over process, power supply, and temperature variations and set a correct DC bias level for the output signal.

The input signal IN is received at a first terminal of a capacitor CN. A second terminal of the capacitor CN is connected to node B. A gate of an eleventh transistor 511 and a gate of a twelfth transistor 512 are connected to the node B. A source of the eleventh transistor 511 is connected to VDD and a drain of the eleventh transistor 511 is connected to a node D. A drain of the twelfth transistor 512 is connected to the node D and a source of the twelfth transistor 512 is connected to ground. The eleventh transistor 511 and the twelfth transistor 512 operate as a first or first stage inverter to invert the signal at the node B to the node D. A gate of a thirteenth transistor 513 and a gate of a fourteenth transistor 514 are connected to the node D. A source of the thirteenth transistor 513 is connected to VDD and a drain of the thirteenth transistor 513 is connected to an output node for the signal ON. A drain of the fourteenth transistor 514 is also connected to the output node ON and a source of the fourteenth transistor 514 is connected to ground. The thirteenth transistor 513 and the fourteenth transistor 514 operate as a second inverter or second stage inverter and generate the corrected full-level CMOS positive clock signal ON.

For the replica bias portion 563, a first terminal of a resistor RN is connected to the node B and a second terminal is connected to a node THN. The value of the resistor RN is chosen such that it is low enough to couple the DC level of THN to node B while it is high enough to provide AC isolation between node THN and node B. A source of a fifteenth transistor 515 is connected to VDD and a drain and gate of the fifteenth transistor 515 are connected to the node THN. A sixteenth transistor 516 has a drain and gate connected to the node THN and a source connected to ground. A source of a seventeenth transistor 517 is connected to VDD and a drain of the seventeenth transistor 517 is connected to the node THN. A gate of the seventeenth transistor 517 is operable to receive a positive adjustment signal NP. An eighteenth transistor 518 has a drain also connected to the node THN and a source connected to ground. A gate of the eighteenth transistor 518 is operable to receive a negative adjustment signal NN.

The non-corrected sinusoidal signal IN is AC coupled to the inverter portion 562 through the capacitor CN. AC coupling removes the DC component of signal IN thus removes any duty cycle error introduced by the previous stages that generate IN. Due to the high speed operation and application of this circuit, the capacitance value of the capacitor CN can be relatively small so that is suitable for integration. The DC bias for the signal at the node B is provided by the replica bias portion 563, which is a diode connected inverter. The transistors 515 and 516 comprise a scaled inverter wherein the sizes of the transistors 515 and 516 are a scaled version of the first inverter comprised of the transistors 511 and 512. Employing replica bias after AC coupling automatically tracks a threshold of the first inverter comprised of the transistors 511 and 512 over process, power supply, and temperature variations and adjusts the DC bias level at the node B to a proper value. As a result, any substantial DC offset should be removed from the converter portion 562. The threshold value of the replica bias portion 563 can be further adjusted by selecting values of the seventeenth and eighteenth transistors 517 and 518. The gate of the seventeenth transistor 517 is controlled by the positive adjustment signal NP and the gate of the eighteenth transistor 518 is controlled by the negative adjustment signal NN, which operate together in a push-pull mode for the threshold value adjustment.

The left hand circuit of FIG. 5A operates in conjunction with the right hand circuit of FIG. 5B to convert the pair of incoming sinusoidal signals IP and IN to duty cycle corrected clock signals OP and ON. The left hand circuit of FIG. 5A, also referred to as a positive path, converts the sinusoidal signal IP to the square wave OP and also corrects duty cycle errors/distortions present in the sinusoidal signal IP according to the adjustment signals PP and PN. The right hand circuit of FIG. 5B, also referred to as a negative path, converts the sinusoidal signal IN to the square wave ON and also corrects duty cycle errors/distortions present in the sinusoidal signal IN according to the adjustment signals NP and NN. Further details on generating the adjustment signals are provided infra.

Figure 6A:
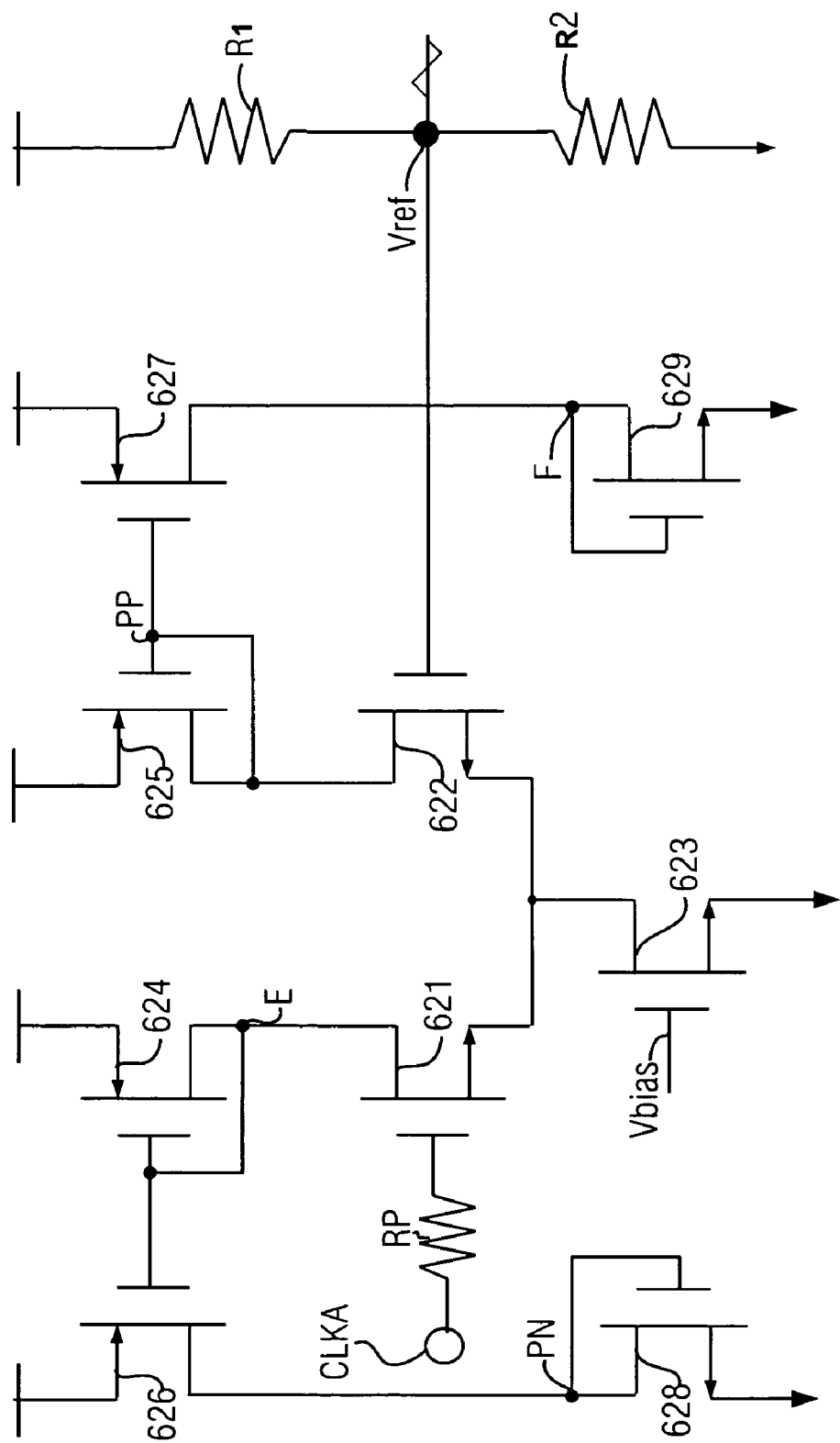
FIG. 6A is a schematic diagram of a left portion of a feedback circuit in accordance with an aspect of the present invention.

FIG. 6A is a schematic diagram of a left portion of a feedback circuit in accordance with an aspect of the present invention. The left portion illustrated can be employed as the feedback circuit 304 in FIG. 3.

The left portion operates to sense a DC level of a buffered clock signal CLKA through a low pass filter. The DC level is then compared with an ideal 50% duty cycle reference voltage. Any difference is amplified and mirrored to produce two feedback/control signals PP and PN, which can then be employed by a differential to single end converter, such as illustrated in FIG. 5A, to adjust the duty cycle.

The buffered clock signal CLKA is received at a first terminal of a resistor RP. A second terminal of the resistor RP is connected to a gate of a first transistor 621, which also has a drain connected to a node E. The gate capacitance of the first transistor 621 and the resistor RP operate as a low pass filter. As a variation of this invention, additional capacitance can be added at the gate of transistor 621 if the gate capacitance of transistor 621 is not big enough. A second transistor 622 has its source connected to a source of the first transistor 621. A third transistor 623 has a drain connected to the sources of the first transistor 621 and the second transistor 622, has a source connected to ground, and a gate connected to a bias voltage (Vbias). A fourth transistor 624 operates as a diode and has a gate and drain connected to the node E and a source connected to VDD. A fifth transistor 625 also operates as a diode and has a gate and drain connected to a PP node that generates the PP adjustment signal. The fifth transistor 625 has a source connected to VDD.

A sixth transistor 626 has a source connected to VDD and a gate connected to the node E. A seventh transistor 627 has a source connected to VDD and a gate connected to the PP node. An eighth transistor 628 operates as a diode and has a source connected to ground and a drain and gate connected to a PN node that generates a PN adjustment signal. The drain of the eighth transistor 628 is also connected to a drain of the sixth transistor 626. A drain and gate of a ninth transistor 629 are connected to a node F and a drain of the seventh transistor 627.

The reference voltage Vref is provided to the gate of the second transistor 622 by a resistor ladder comprised of a first resistor R1 and a second resistor R2. A first terminal of the first resistor R1 is connected to VDD and a second terminal is connected to a Vref node that provides the reference voltage Vref. A first terminal of the second resistor R2 is connected to the Vref node and a second terminal of the second resistor R2 is connected to ground. Typically, the resistance values of the resistors R1 and R2 are set to be equal corresponding to a fifty percent duty cycle. However, other resistance values can be selected that correspond to duty cycle values other than fifty percent.

Figure 6B:
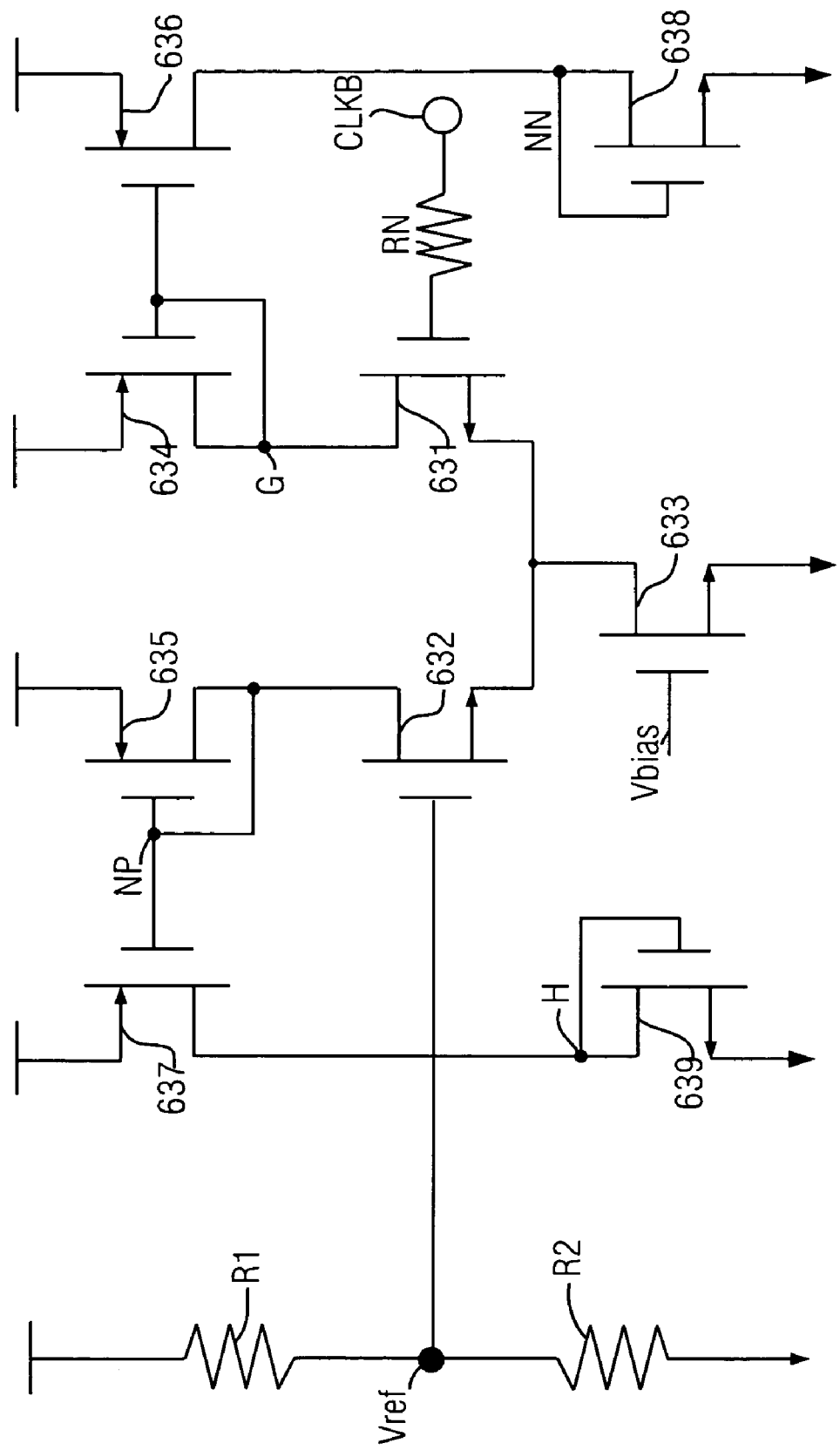
FIG. 6B is a schematic diagram of a right portion of a feedback circuit in accordance with an aspect of the present invention.

FIG. 6B is a schematic diagram of a right portion of a feedback circuit in accordance with an aspect of the present invention. The right portion illustrated, along with the left portion illustrated in FIG. 6A can collectively be employed as the feedback circuit 304 in FIG. 3.

The right portion operates to sense a DC level of a buffered clock signal CLKB through a low pass filter. The DC level is then typically compared with an ideal fifty percent duty cycle reference voltage. Any difference is amplified and mirrored to produce two feedback/control signals NP and NN, which can then be employed by a differential to single end converter, such as illustrated in FIG. 5B, to adjust the duty cycle.

The buffered clock signal CLKB is received at a first terminal of a resistor RN. A second terminal of the resistor RN is connected to a gate of a first transistor 631, which has a drain connected to a node G. The gate capacitance of the first transistor 631 and the resistor RN operate as a low pass filter. As a variation of this invention, additional capacitance can be added at the gate of transisitor 631 if the gate capacitance of transistor 631 is not big enough. A second transistor 632 has its source connected to a source of the first transistor 631. A third transistor 633 has a drain connected to the drains of the first transistor 631 and the second transistor 632, has a source connected to ground, and a gate connected to a bias voltage (Vbias). A fourth transistor 634 operates as a diode and has a gate and drain connected to the node G and a source connected to VDD. A fifth transistor 635 also operates as a diode and has a gate and drain connected to a NP node that generates the NP adjustment signal. The fifth transistor 635 has a source connected to VDD.

A sixth transistor 636 has a source connected to VDD and a gate connected to the node G. A seventh transistor 637 has a source connected to VDD and a gate connected to the NP node. An eighth transistor 638 operates as a diode and has a source connected to ground and a drain and gate connected to a NN node that generates an NN adjustment signal. The drain of the eighth transistor 638 is also connected to a drain of the sixth transistor 636. A drain and gate of a ninth transistor 639 are connected to a node H and a drain of the seventh transistor 637.

The reference voltage Vref is provided to the gate of the second transistor 632 by the resistor ladder described with respect to FIG. 6A. The ladder is comprised of a first resistor R1 and a second resistor R2. A first terminal of the first resistor R1 is connected to VDD and a second terminal is connected to a Vref node that provides the reference voltage Vref. A first terminal of the second resistor R2 is connected to the Vref node and a second terminal of the second resistor R2 is connected to ground. Typically, the resistance values of the resistors R1 and R2 are set to be equal corresponding to a fifty percent duty cycle. However, other resistance values can be selected that correspond to duty cycle values other than fifty percent.

The left hand circuit of FIG. 6A and the right hand portion of FIG. 6B operate collectively as a feedback circuit and can be employed in a duty cycle correction component in accordance with the present invention. It is, however, appreciated that the left portion and the right portion share the reference voltage ladder.

In prior art systems, the duty cycle correction components were limited to measure the crossing points of CLKA and CLKB and then comparing the crossing points to make them equally spaced in time domain. Therefore, the duty cycle error shown in FIG. 2A can be corrected but the duty cycle error shown in FIG. 2C and FIG. 2D cannot be corrected since the crossing points are equally spaced in FIG. 2C and FIG. 2D. However, the present invention is operative to extract the average DC level of CLKA and CLKB, which represents the absolute duty cycle value of signal CLKA or CLKB itself and compare it with a reference voltage Vref. As a result, the duty cycle component of the present invention is operable to correct duty cycle distortions/errors including wide/narrow pulses, as illustrated in FIG. 2A, as well as high-crossed overlapping pulses, as illustrated in FIG. 2C, and low-crossed non-overlapping pulses, as illustrated and described in FIG. 2D.

To further illustrate and explain operation of the feedback circuit of the present invention, the following example is provided. For this example, CLKA has a higher than fifty percent duty cycle (wide pulse) and CLKB has a less than fifty percent duty cycle (narrow pulse).

The low pass filter formed by the resistor RP and a gate capacitance of the first transistor 621 of FIG. 6A produce a voltage at the gate of the first transistor 621 that is proportional to the clock duty cycle of CLKA by removing the AC component of the CLKA clock signal. Similarly, the low pass filter formed by the resistor RN and a gate capacitance of the first transistor 631 of FIG. 6B produce a voltage at the gate of the first transistor 631 that is proportional to the clock duty cycle of CLKB by removing the AC component of the CLKB clock signal. As a result, the voltage at the gate of the transistor 621 of FIG. 6A is higher than the voltage Vref and the voltage at the gate of the transistor of 632 of FIG. 6B is lower than the voltage Vref. Because of this, the voltage at the node PP increases and the voltage at the node E decreases. Additionally, after the current mirror, a voltage of the node PN increases and a voltage of the node F decreases.

With the PP and PN signals increased or higher, the DC level of the replica bias is pulled down for the left portion of the amplifier of FIG. 5A. Therefore, the DC level at the node A of FIG. 5A is below a threshold value of the first inverter causing an output pulse to the node C to become wider. After the second inverter of FIG. 5A (the third and fourth transistors 503 and 504), the output of OP becomes narrower, after propagating through buffer 306 in FIG. 3 with even number of buffer stages thus, correcting the wide pulse of CLKA. The right portion of the feedback circuit (FIG. 6B) and the right portion of the amplifier/converter (FIG. 5B) operate in a similar, but opposite, manner to cause the output ON to become wider, thus correcting the narrow pulse of CLKB, in this example.

It is appreciated by the inventors of the present invention that the application of feedback block of FIG. 6A and FIG. 6B is not limited to generate the adjustment signals from node PP/PN or NP/NN. For example, if the total number of inverting stages from IP to CLKA is odd, adjustment signals can be obtained from nodes E/F or G/H instead. Moreover, the amplifier illustrated and described in FIGS. 5A and 5B is an example of a suitable amplifier that can be employed for the present invention. The inventors of the present invention appreciate that variations of the amplifier illustrated and described in FIGS. 5A and 5B as well as other amplifiers can be used to implement the function of the amplifier 302 in FIG. 3 and be in accordance with the present invention. Likewise, it is also appreciated that variations of the feedback circuit illustrated and described in FIGS. 6A and 6B as well as other suitable feedback circuits can be employed in accordance with the present invention. For example, variations to extract the DC level of the clock signal by low pass filtering it and compares with a reference voltage Vref to achieve desired duty cycle are contemplated and included in the scope of the present invention.

Figure 7:
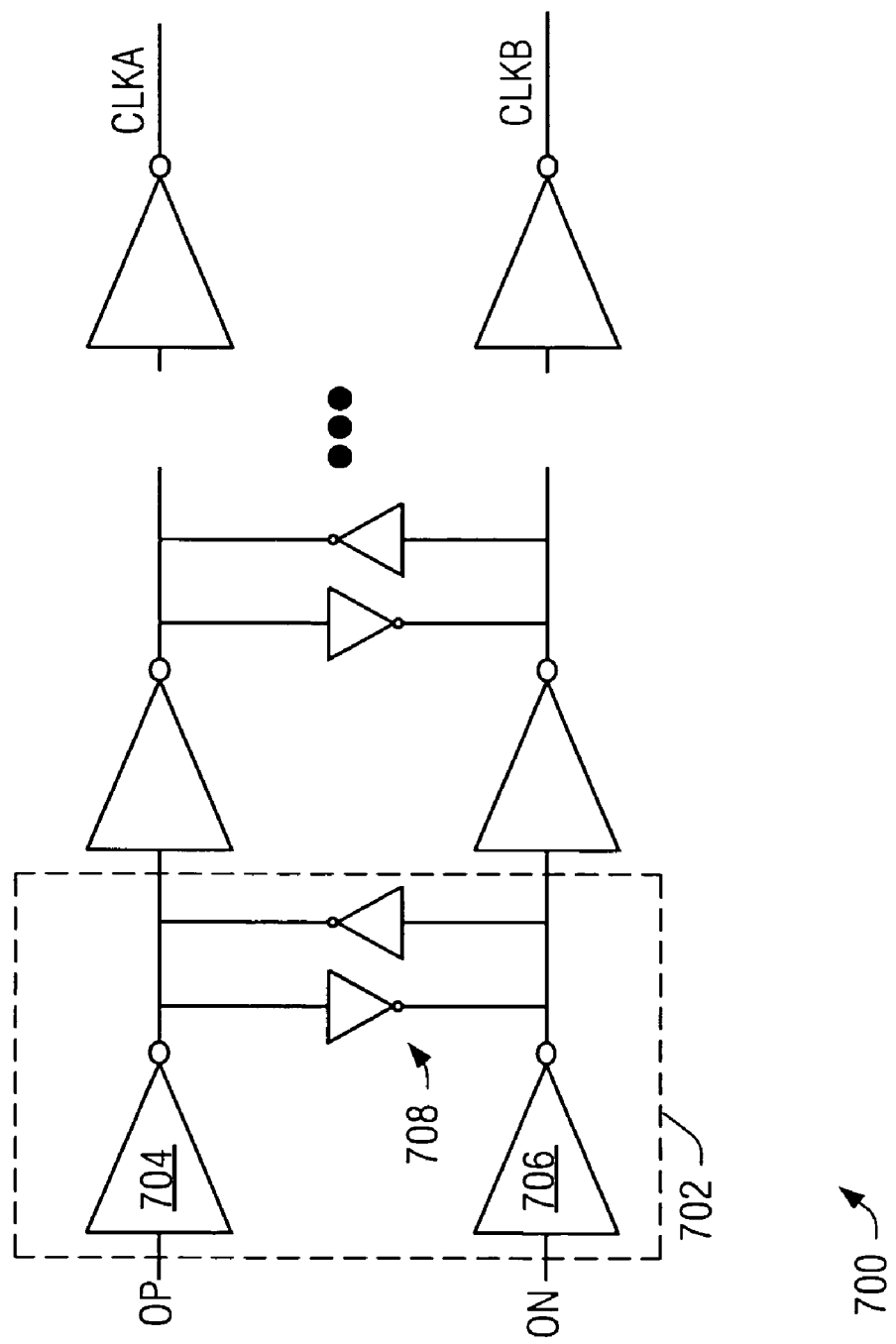
FIG. 7 is a schematic diagram illustrating a clock buffer in accordance with an aspect of the present invention.

FIG. 7 is a schematic diagram illustrating a clock buffer 700 in accordance with an aspect of the present invention. The clock buffer can be employed as block 306 in the duty cycle correction component described with respect to FIG. 3. The clock buffer 700 buffers a corrected clock signal and generates a buffered clock signal. The clock buffer 700 is cross coupled in order to correct skewed error shown in FIG. 2B.

The clock buffer 700 receives a corrected clock signal that is represented as a pair of complementary square wave signals, OP and ON, and generates a buffered clock signal comprised of a pair of complementary square wave signals, CLKA and CLKB. The clock buffer 700 comprises two inverter chains with fan out suitable to a particular process technology and operation frequency. The OP and ON input signals are full level square wave clock signals such as those coming from the amplifier 302 of FIG. 3. The outputs are CLKA and CLKB, which are final output employed to drive high speed digital circuits 112 in FIG. 1B and 122 in FIG. 1C and also as feedback to the feedback circuit 304 of FIG. 3.

The clock buffer 700 is comprised of a number of stages. An initial stage 702 is described, but subsequent stages operate in a similar manner. For the initial stage, an upper inverter 704 receives the OP signal and a lower inverter 706 receives the ON signal. Two cross coupled inverters 708 are connected to the outputs of the upper and lower inverters 704 and 706. This cross coupled feedback is employed to push-pull rising and falling edges of CLKA and CLKB so that the two clocks align to a middle or center point of their edges. As a result, if there is skew present, the cross coupled feedback serves to reduce or remove the skew. The accuracy and amount of correction is at least somewhat dependent on the number of stages employed in the buffer 700 and the sizes of the stages. Generally, the more stages there are, the more skew correction that can be performed. Additionally, the larger the sizes of the individual inverters 708, the stronger the push-pull correction and, consequently, the more correction that can be performed.

FIGS. 5A, 5B, 6A, 6B, and 7 serve to illustrate examples of suitable circuits that can be employed to perform the functions of the amplifier 302, buffer 304, and feedback circuit 306 of FIG. 3. However, it is appreciated that variations of the circuits described above can also be employed in the duty cycle correction component of FIG. 3.

The duty cycle correction component of FIG. 3 has a number of advantages associated with it relative to conventional correction components. Appropriately sizing transistors in first and second inverter stages of the differential to single end amplifier, the component operates with a reduced amount of current (e.g., has a current starving nature). Therefore, the component is able to operate at a relatively high speed and can be employed in ultra-high speed serial communication, which includes operation in a multi-GHz range.

Additionally, the duty cycle correction component can include replica bias components as illustrated in components 553 and 563 of FIGS. 5A and 5B, respectively, that are operable to track inverter threshold values over process, voltage, and temperature variations and adjust DC bias level of an incoming clock signal (e.g., IP and IN) appropriately after AC coupling. As a result, duty cycle distortion/error introduced by the duty cycle correction component itself (e.g., the amplifier 302 or block 552 in FIG. 5A or block 562 in FIG. 5B) can be mitigated or reduced.

Further, the duty cycle correction component can be adjusted by using push-pull control to enlarge the correction range (e.g., the seventh transistor 507 and eighth transistor 508 of FIG. 5A). Additionally, duty cycle adjustment of the duty cycle correction component can be performed by adjusting the threshold of the replica bias within the amplifier of the duty cycle correction component instead of directly adjusting the first and second inverter stages of the amplifier. This provides power efficiency over traditional/conventional approaches since the replica bias (e.g., 505 and 506 in FIG. 5A) is a scaled down version of the first stage of the amplifier (e.g., 501 and 502 in FIG. 5A).

Finally, the duty cycle correction component of the present invention utilizes input AC coupling (e.g., the capacitors CN and CP shown in FIGS. 5A and 5B) that cancels DC offsets between the differential input sinusoidal signals (e.g., IP and IN). Such DC offsets can be a cause of significant duty cycle errors.

Figure 8:
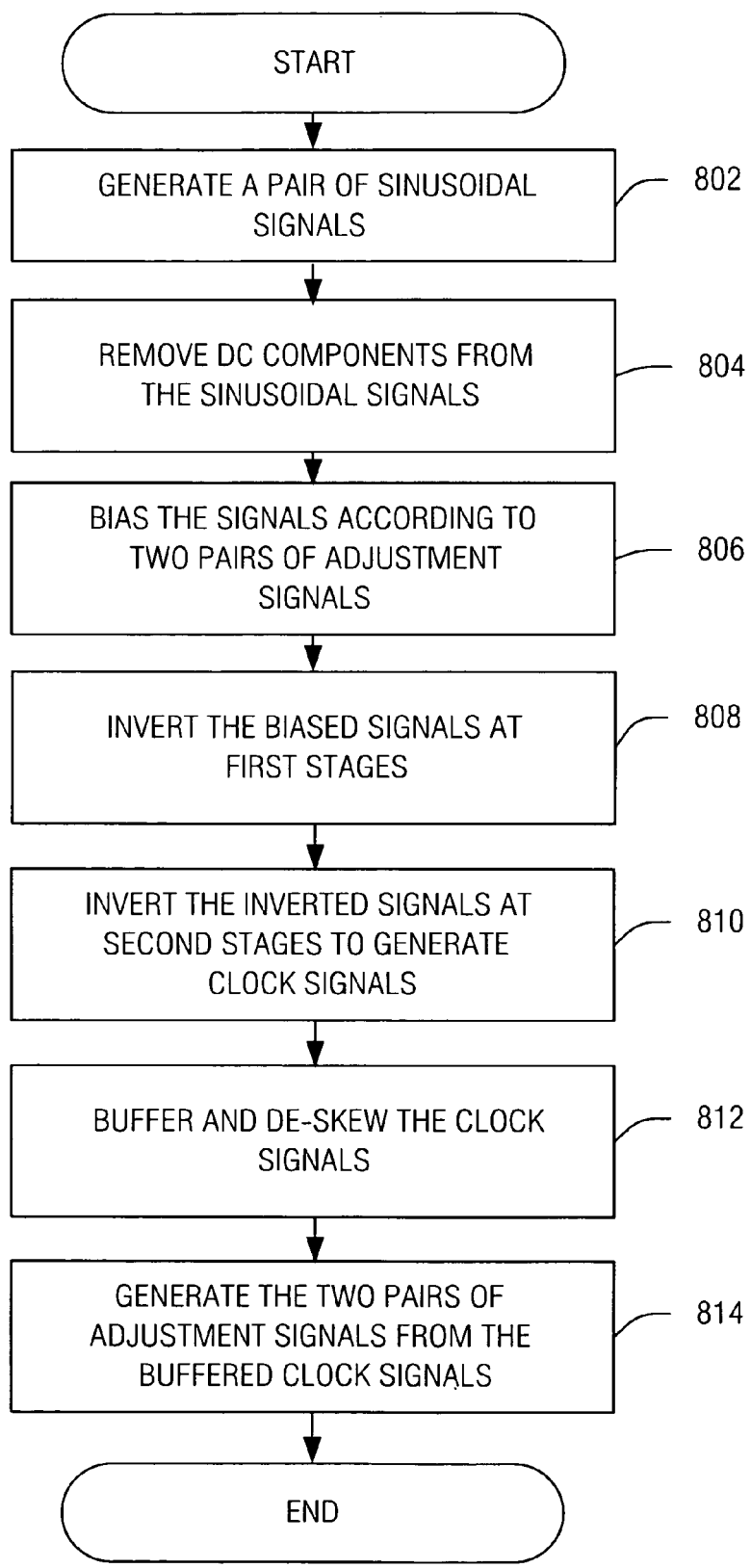
FIG. 8 is a flow diagram illustrating a method of generated a corrected duty cycle clock in accordance with an aspect of the present invention.

In view of the foregoing structural and functional features described supra, methodologies in accordance with various aspects of the present invention will be better appreciated with reference to the above figures. While, for purposes of simplicity of explanation, the methodology of FIG. 8 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

FIG. 8 is a flow diagram illustrating a method of generated a corrected duty cycle clock in accordance with an aspect of the present invention. The method analyzes a distorted clock signal that can have a distorted duty cycle and, using feedback, corrects or adjusts the clock signal to have a desired/selected duty cycle.

The method begins at block 802, wherein a pair of differential sinusoidal signals, comprising a positive sinusoidal signal and a negative sinusoidal signal, are generated by an oscillator (e.g., on-chip oscillator) and a clock generation circuit. Typically, the signals are generated to have a fifty percent duty cycle and be complementary. The oscillator and the clock generation component can introduce distortion and errors into the sinusoidal signals including, DC offsets and duty cycle distortion.

Continuing, the sinusoidal signals are AC coupled at block 804 to remove DC components of the signals, if present. Generally, capacitors with a suitable capacitance value are placed in series with inputs that receive the pair of sinusoidal signals. The AC coupled signals are then replica biased according to two pairs of adjustment signals at block 806. A first pair is employed to adjust and bias a positive signal of the AC coupled signals and a second pair is employed to adjust and bias a negative signal of the AC coupled signals. The adjustment signals are provided by a feedback circuit and correlate to measured absolute duty cycles of the clock signal itself, not the crossing points of the complementary clock pair. The biasing of the AC coupled signals is performed over a relatively wide range of process, voltage, and temperature variations. Additionally, the biasing is determined by the scaled versions of the AC coupled signals thereby reducing power consumption.

The biased signals are then inverted by first stage inverters at block 808. The first stage inverters receive the biased, AC coupled signals and invert them. Then, the once inverted signals are inverted a second time by second stage inverters at block 810 to create a pair of non-inverted complementary square waves (e.g., OP and ON) as clock signals.

The clock signals are then buffered and at least partially de-skewed by a cross coupled buffer at block 812 and provided as buffered clock signals. The buffer typically has an even number of stages that include cross coupled inverters that can partially remove skew present in the signals. The number of stages present as well as the size of the inverters employed determine an amount of skew correction that can be performed. The buffered clock signals are complementary positive and negative square wave signals that have been corrected and buffered.

The two pairs of adjustment signals are generated at block 814 according to the buffered clock signals. The adjustment signals correspond to detected duty cycle values for the positive and negative square wave signals and selected or desired duty cycle values. The first pair of the adjustment signals corresponds to the positive square wave signal of the buffered clock signals and the second pair of the adjustment signals corresponds to the negative square wave signal of the buffered clock signals. The adjustment signals correlate to measured duty cycles of clock signals, not their crossing points. Generally, the selected or desired duty cycle is fifty percent, however other selected/desired duty cycle values can be employed in generating the adjustment signals. Typically, a feedback amplifier such as described with respect to FIGS. 6A and 6B is employed to generate the adjustment signals.

With the proposed duty cycle correction flow of FIG. 8, the invention can correct duty cycle errors including those shown in FIGS. 2A, 2B, 2C and 2D, compared with traditional/conventional approaches that only correct errors in FIGS. 2A and 2B.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A duty cycle correction component comprising:
   a differential to single end amplifier that receives a pair of non-corrected sinusoidal signals and generates a pair of corrected square wave signals according to a first pair of adjustment signals and a second pair of adjustment signals;
   a cross coupled buffer that buffers the pair of corrected square waves and provides a pair of buffered clock signals; and
   a feedback amplifier that receives the pair of buffered clock signals, measures absolute duty cycles of the pair of buffered clock signals, and generates the first and second pairs of adjustment signals according to the measured duty cycles.

2. The component of claim 1, wherein the pair of non-corrected sinusoidal signals include duty cycle distortions.

3. The component of claim 1, wherein the pair of corrected square wave signals have a selected duty cycle of about fifty percent.

4. The component of claim 1, wherein the pair of corrected square wave signals have a selected duty cycle of other than fifty percent.

5. The component of claim 1, wherein the pair of corrected square wave signals comprises a positive square wave signal and a negative square wave signal, wherein the negative square wave signal is complementary to the positive square wave signal.

6. The component of claim 5, wherein the positive square wave signal is generated from a positive sinusoidal signal of the pair of non-corrected sinusoidal signals according to the first pair of adjustment signals.

7. The component of claim 5, wherein the negative square wave signal is generated from a negative sinusoidal signal of the pair of non-corrected sinusoidal signals according to the second pair of adjustment signals.

8. The component of claim 1, wherein the differential to single end amplifier comprises a pair of AC coupling components that remove DC components from the pair of non-corrected sinusoidal signals to generate a pair of DC decoupled signals.

9. The component of claim 8, wherein the differential to single end amplifier further comprises a pair of biasing components that bias the pair of DC decoupled signals according to a selected duty cycle and the first and second pair of adjustment signals.

10. The component of claim 9, wherein the differential to single end amplifier further comprises a two stage inverter that converts the biased pair of signals to the pair of corrected square wave signals that have about the selected duty cycle.

11. The component of claim 1, wherein the cross coupled buffer comprises a number of stages, wherein respective stages include a pair of cross coupled inverters that at least partially reduce skew from the pair of square wave signals.

12. The component of claim 1, wherein the feedback amplifier measures the absolute duty cycles of the pair of buffered clock signals, compares the measured duty cycles with a desired duty cycle, and generates the two pairs of adjustment signals according to the comparison.

13. The component of claim 12, wherein the desired duty cycle is about fifty percent.

14. The component of claim 12, wherein the desired duty cycle is other than fifty percent.

15. A portion of a differential to single end amplifier comprising:
   an AC coupler that receives an incoming sinusoidal signal and removes DC components from the incoming signal to generate a coupled signal;
   a dual stage inverter that converts the coupled signal into a square wave signal with a selected duty cycle; and
   a replica bias component that receives a positive adjustment signal and a negative adjustment signal, generates a DC voltage to bias the AC coupled signal to the input of the dual stage inverter according to the threshold of the scaled version of the first stage of the dual stage inverter, the positive adjustment signal, and the negative adjustment signal.

16. The portion of claim 15, wherein the dual stage inverter comprises a first stage that inverts the decoupled signal into an inverted signal and a second stage that inverts the inverted into the square wave signal.

17. A method of generating a corrected duty cycle clock comprising:
   generating a pair of differential sinusoidal signals comprising a positive sinusoidal signal and a negative sinusoidal signal;
   removing DC components from the pair of differential sinusoidal signals;
   biasing the positive sinusoidal signal according to a first pair of adjustment signals;
   biasing the negative sinusoidal signal according to a second pair of adjustment signals;
   inverting the biased signals into an inverted pair of signals; and
   inverting the inverted pair of signals into a differential pair of square waves.

18. The method of claim 17, further comprising measuring a duty cycle of a positive buffered clock signal and generating the first pair of adjustment signals according to the measured duty cycle and a selected duty cycle.

19. The method of claim 18, further comprising measuring a duty cycle of a negative buffered clock signal and generating the second pair of adjustment signals according to the measured duty cycle and the selected duty cycle.

20. The method of claim 19, further comprising buffering the differential pair of square waves to provide the positive buffered clock signal and the negative buffered clock signal.

21. The method of claim 20, further comprising de-skewing the differential pair of square waves.

* * * * *